United States Patent
Okubo et al.

(10) Patent No.: US 6,392,459 B1
(45) Date of Patent: May 21, 2002

(54) GATE SIGNAL GENERATING CIRCUIT, SEMICONDUCTOR EVALUATION APPARATUS, AND SEMICONDUCTOR EVALUATING METHOD

(75) Inventors: Masao Okubo; Dai Sasaki, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/666,027

(22) Filed: Sep. 20, 2000

(30) Foreign Application Priority Data

Mar. 30, 2000 (JP) ........................................ 2000-092890

(51) Int. Cl.[7] .......................... H03K 3/017; H03K 5/04; H03K 7/08

(52) U.S. Cl. ........................................ 327/172; 327/31

(58) Field of Search ............................ 327/31–39, 172, 327/47–49; 702/57, 79

(56) References Cited

U.S. PATENT DOCUMENTS 5,479,118 A * 12/1995 Niijima ........................ 327/38
5,534,805 A *  7/1996 Miyazaki et al. ............ 327/144
5,923,191 A *  7/1999 Nemetz et al. ............... 327/20

FOREIGN PATENT DOCUMENTS

JP          4-169864         6/1992

\* cited by examiner

Primary Examiner—Toan Tran
Assistant Examiner—Quan Tra
(74) Attorney, Agent, or Firm—Leydig, Voit & Mayer, Ltd.

(57) ABSTRACT

When continuously outputted pulses from a first pulse to an (N+1)th (where N is an integer) are received, a pulse specifying circuit specifies a number N of a pulse whose properties are to be measured. Further, a gate generating circuit generates a gate signal which is at high level during a period from the end of the (N−1)th pulse to the start of the Nth pulse and which is at low level during a period from the end of the Nth pulse to the start of the (N+1)th pulse. A semiconductor evaluating apparatus measures the width of the Nth pulse based on the generated gate signal.

10 Claims, 10 Drawing Sheets

GATE SIGNAL GENERATING CIRCUIT, SEMICONDUCTOR EVALUATION APPARATUS, AND SEMICONDUCTOR EVALUATING METHOD

FIELD OF THE INVENTION

The present invention relates to a gate signal generating circuit for generating a gate signal for measuring the width and level of each of continuous pulse signals outputted from a device (such as an integrated circuit), and a semiconductor evaluating apparatus that uses such a gate signal generating circuit.

BACKGROUND OF THE INVENTION

Conventionally, when measuring the width and level of each of continuous pulse signals outputted from a device (such as an integrated circuit) that is the object to be measured (evaluated) by using a semiconductor evaluating apparatus, since the pulse width and the pulse level are constant, the measurement is performed by setting a gate signal corresponding to an arbitrary pulse using a program in a computer.

As integrated circuits are becoming more and more multifunctional day by day, pulse signals outputted from the integrated circuit (IC) tend to have a waveform in which the pulse widths and the pulse levels are random. In order to measure such random widths and levels in the waveform, it is necessary to set a gate signal to a specific pulse to be measured. An external circuit capable of setting the gate signal is provided outside the semiconductor evaluating apparatus when the semiconductor evaluating apparatus does not have the means for setting the gate signal of a specific pulse. Width and level of a specific pulse are measured by using a signal output by this circuit as the gate signal.

A conventional system of measuring the pulse width and the pulse level by setting a gate signal to an arbitrary pulse when the width and level of a pulse outputted from a device to be measured are constant will be described first.

FIG. 8 is a functional block diagram showing a semiconductor evaluating system. In this system, conditions for measurement of voltage, current or the like of the integrated circuit are set and the signal output from the integrated circuit is measured by using the semiconductor evaluating apparatus.

As shown in FIG. 8, IC 35 is mounted on a plate 36. A semiconductor evaluating apparatus 37 sets the measurement conditions such as a DC voltage and a direct current to be applied to the IC 35 and measures the voltage and current outputted from the IC 35, time of an output pulse, and the like. Cables 38 serve as an interface of an electric signal between the semiconductor evaluating apparatus 37 and the IC 35.

A computer 39 provides a control over setting of the measurement conditions. These measurement conditions are outputted to the semiconductor evaluating apparatus 37. In the semiconductor evaluating apparatus 37, a gate signal generating device 40 for measuring time duration of the pulse is provided and a gate signal is set using the computer 39. An external gate signal 41 obtained from the outside of the semiconductor evaluating apparatus 37 can be also used as a gate signal. Some semiconductor evaluating apparatuses can input an AC signal, measure an output AC signal, and determine input and output expectation values of a function pattern.

In the conventional semiconductor evaluating system shown in FIG. 8, when measuring the width of a pulse outputted from the IC 35, the internal gate signal generating device 40 which can be controlled using a computer program by the computer 39 is provided.

When measuring the pulse level, output pulse 42 from the IC 35 is converted into a DC voltage by a sample and hold circuit 43. A DC voltage 44 outputted from the sample and hold circuit 43 is measured as a pulse level by the semiconductor evaluating apparatus 27. At this time, the sample and hold circuit 43 latches data by the gate signal 45.

The operation of the semiconductor evaluating system shown in FIG. 8 will be described below. As shown in FIG. 9, in the case of measuring the width of an output pulse 46 of the IC in which the pulse widths are equal to each other like $t_1 = t_2 = \ldots = t_{n+1} = t_n = t_{n+1} = \ldots$, since the pulse width is $t_1 = t_2 = \ldots = t_{n-1} = t_n = t_{n+1} = \ldots$, when an internal gate signal is set using the computer 39, it is sufficient to set the gate signal at H (high) level with respect to an arbitrary pulse. Any of signals 47, 48, 49, 50 and 51 can be used as a gate signal for measurement.

As shown in FIG. 10, in the case of measuring the level of output pulses 52 of the IC in which the pulse levels are $v_1 = v_2 = \ldots = v_{n-1} = v_n = v_{n+1} = \ldots$, the output pulse 52 is converted to a DC voltage by the sample and hold circuit 43 and the DC voltage outputted from the sample and hold circuit 43 is measured. The output pulse 52 is converted into a DC voltage at the timing when the gate signal of the sample and hold circuit 43 is changed from H level to L (low) level. In the case of setting the gate signal using the computer 39, therefore, since the pulse levels are $v_1 = v_2 = \ldots = v_{n-1} = v_n = v_{n+1} = \ldots$, it is sufficient to change the gate signal from H level to L level at an arbitrary pulse. Any of the signals 53, 54, 55, 56 and 57 can be used as a gate signal for measurement.

In the conventional integrated circuit, the pulse width and pulse level in an output waveform are constant. Consequently, a gate signal is set to an arbitrary pulse as mentioned above, and the pulse width and the pulse level are measured by the semiconductor evaluating apparatus.

In the case of measuring a specific pulse width or pulse level in an output waveform in which the pulse width is not constant (that is, $t_1 \neq t_2 \neq \ldots t_{n-1} \neq t_n \neq t_{n+1} \neq \ldots$) and the pulse level is not also constant (that is, $v_1 \neq v_2 \neq \ldots v_{n-1} \neq v_n \neq v_{n+1} \neq \ldots$), however, the position of a gate signal has to be set to the specific pulse. A semiconductor evaluating apparatus which does not have the function of setting a gate signal cannot measure a waveform in which the pulse widths and the pulse levels are random.

SUMMARY OF THE INVENTION

It is an object of this invention to provide a gate signal generating circuit capable of setting a gate signal corresponding to a specific pulse and a semiconductor evaluating apparatus using the circuit. It is another object to provide a semiconductor evaluating apparatus such that even if it does not have the function of setting a gate signal, it is possible to measure a waveform in which the pulse widths and the pulse levels are random.

According to one aspect of this invention, an arbitrary Nth pulse in pulses to be measured which are continuously outputted in the order of 1→2→ . . . →(N−1)→N→(N+1)→ . . . (N is an integer) is specified, the gate signal which is at high level during a period from the end of the (N−1)th pulse to the start of the Nth pulse and which is at low level during a period from the end of the Nth pulse to the start of the (N+1)th pulse is generated, and the width of the Nth pulse is measured by using the gate signal.

According to another aspect of this the invention, an arbitrary Nth pulse in pulses to be measured which are outputted in such a manner that the first to the Xth pulses are periodically repeated like 1→2→ . . . →(N−1)→N→(N+1)→ . . . →X→1→2→ . . . (N−1)→N→(N+1) . . . →X→ . . . (N and X are integers) is specified, a gate signal which is at high level during a period from the end of the (N−1)th pulse to the start of the Nth pulse and which is at low level during a period from the end of the Nth pulse to the start of the (N+1)th pulse is generated, and the width of the Nth pulse is measured by using the gate signal.

According to still another aspect of this invention, an arbitrary Nth pulse in pulses to be measured which are continuously outputted in the order of 1→2→ . . . →(N−1) →N→(N+1)→ . . . (N is an integer) is specified, a gate signal which is at high level during a period from the start of the Nth pulse to the end of the Nth pulse is generated, the output level of the pulse to be measured at the time point the gate signal goes high is held, and the level of the Nth pulse is measured.

Other objects and features of this invention will become apparent from the following description with reference to the accompanying drawings.

DESCRIPTION OF THE PREFERRED EMBODIMENTS

The timing of a gate signal with respect to an output pulse of an integrated circuit which outputs pulses having random widths will be described with reference to the chart of FIG. 1.

Figure 1:
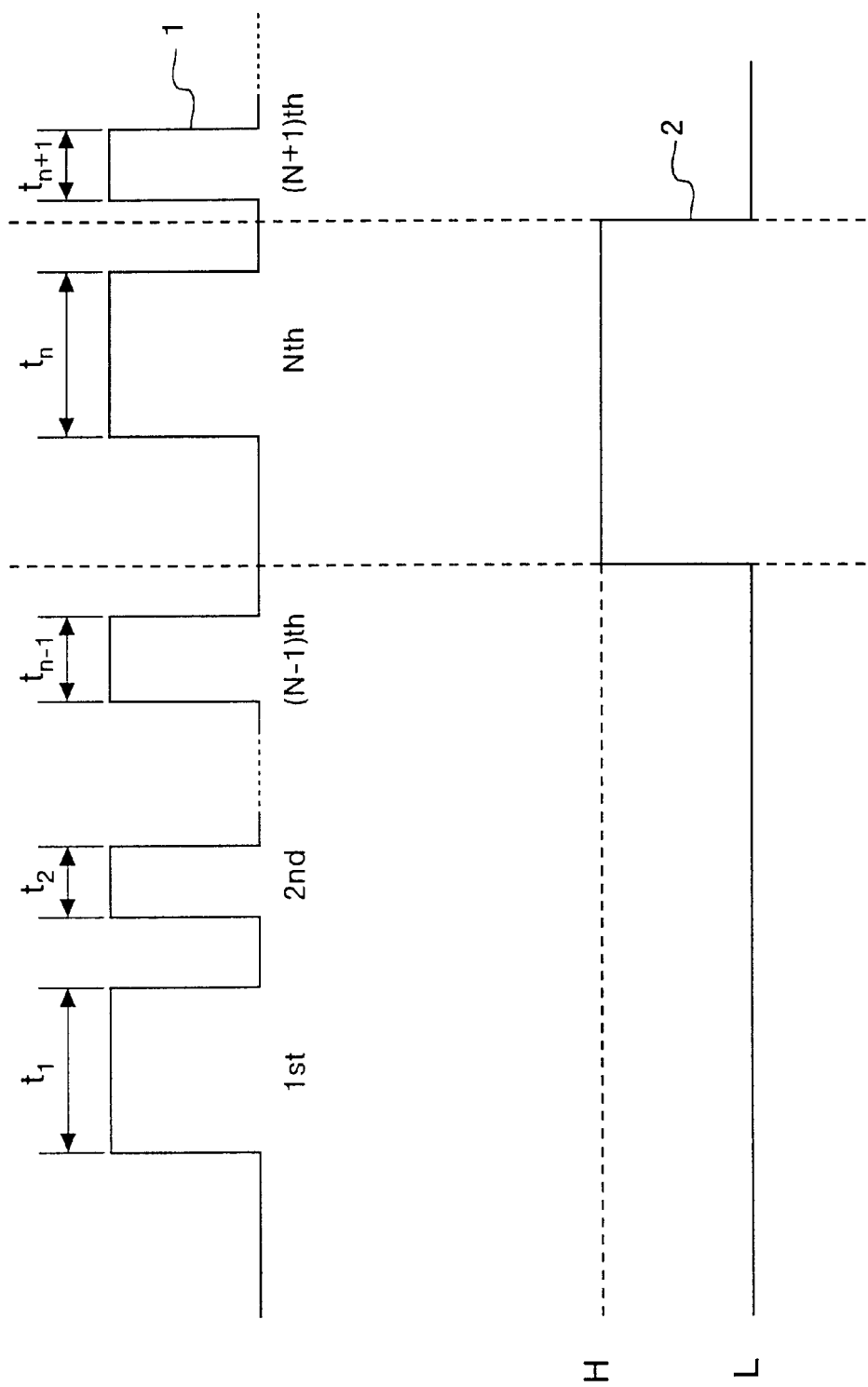
FIG. 1 is a timing chart showing output pulses having random widths and a gate signal for measuring the pulse widths.

It is assumed in FIG. 1 that the integrated Circuit outputs pulses 1 having random widths such as $t_1 \neq t_2 \neq$ . . . $\neq t_{n-1} \neq t_n \neq t_{n-1} \neq$ . . . A gate signal 2 is a signal utilized to measure the width of the Nth pulse in the output pulses 1.

Conditions with respect to time of the gate signal 2 for measuring the width of the Nth pulse are that the gate signal 2 is high in a period from the trailing edge of the (N−1)th pulse in the output pulses 1 to the rising edge of the Nth pulse and is low in a period from the trailing edge of the Nth pulse to the rising edge of the (N+1)th pulse.

Figure 2:
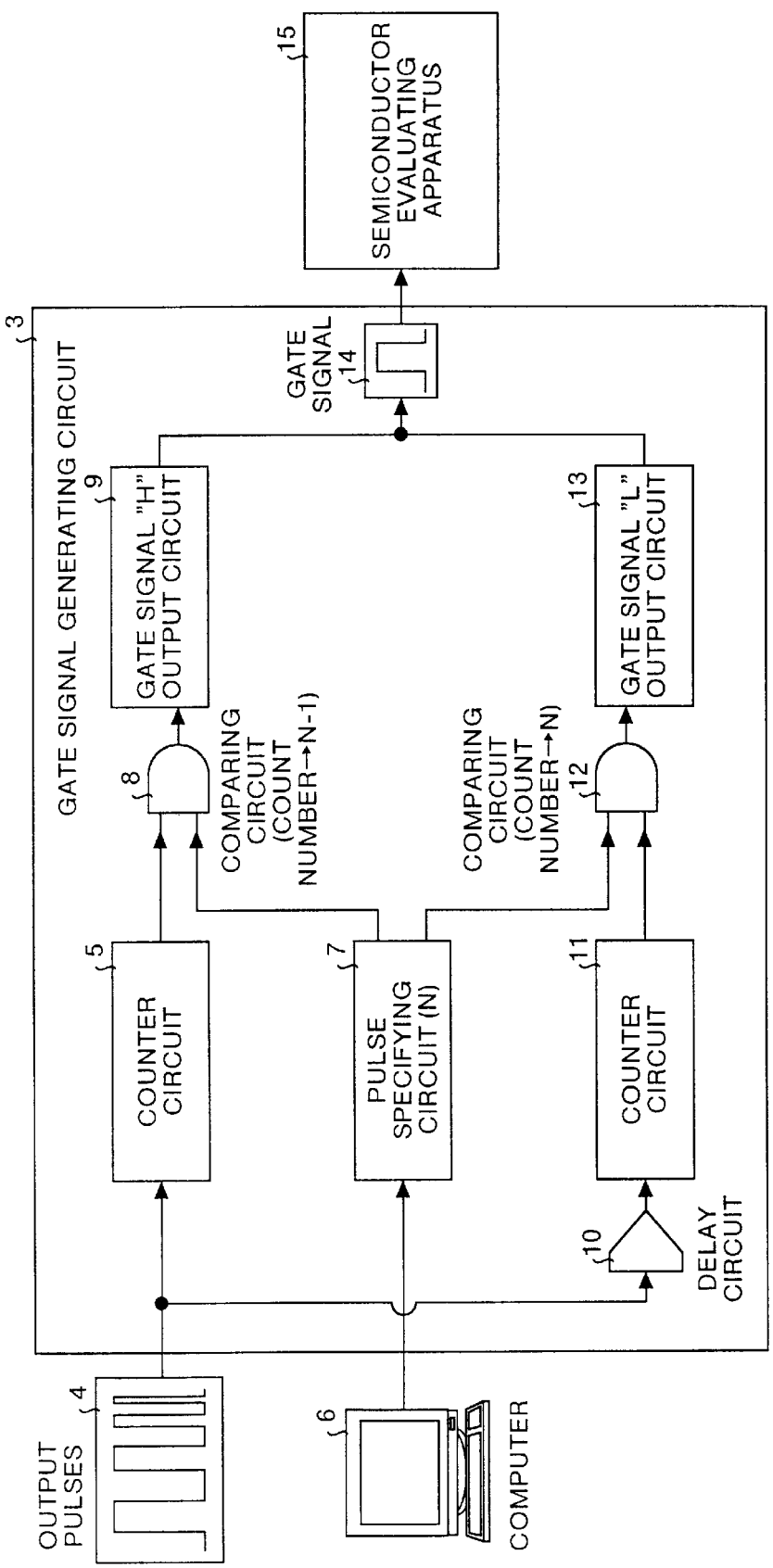
FIG. 2 is a functional block diagram showing a gate signal generating circuit and a semiconductor evaluating apparatus using the circuit according to a first embodiment of the invention.

FIG. 2 is a functional block diagram showing a gate signal generating circuit and a semiconductor evaluating apparatus using this gate signal generating circuit according to the first embodiment of the invention. The gate signal generating circuit 3 of the first embodiment has, at the front stage, counter circuits 5 and 11 for counting the number of output pulses 4 outputted from an integrated circuit and a pulse specifying circuit 7 for specifying the pulse whose width is to be measured.

The counter circuit 5 receives the output pulses 4 and counts the number of trailing edges of the pulses. The counter circuit 11 receives the output pulses 4 via a delay circuit 10 and counts the number of trailing edges of the pulses. Further, in the pulse specifying circuit 7 is set the number of trailing edges of pulses using a program by a computer 6. For example, in the case of measuring the width of the Nth pulse, N is set as the set value of the pulse specifying circuit 7.

A comparing circuit 8 compares the value counted by the counter circuit 5 with the value set in the pulse specifying circuit 7. Specifically, when the value set in the pulse specifying circuit 7 is N, the comparing circuit 8 determines whether the value counted by the counter circuit 5 is equal to (N−1) or not. A gate signal output circuit 9 outputs a signal of H level when the comparing circuit 8 determines that the counted value is equal to (N−1).

A comparing circuit 12 compares the value counted by the counter circuit 11 with the value set in the pulse specifying circuit 7. Specifically, when the value set in the pulse specifying circuit 7 is N, the comparing circuit 12 determines whether the value counted by the counter circuit 11 is equal to N or not. A gate signal output circuit 13 outputs a signal of L level when the comparing circuit 12 determines that the counted value is equal to N.

Gate signals 14 generated by the gate signal output circuits 9 and 13 are outputted to a semiconductor evaluating apparatus 15. The semiconductor evaluating apparatus 15 sets measurement conditions such as a DC voltage and a direct current to the integrated circuit and measures voltage and current of the integrated circuit and time duration of an output pulse.

Operation of the gate signal generating circuit according to the first embodiment will be described in detail with reference to the drawings.

As shown in FIG. 2, the output pulses 4 from the device are supplied to the gate signal generating circuit 3 and the number of trailing edges of the pulses are counted by the counter circuit 5 at the next stage. On the other hand, the number of trailing edges of the pulses is set in the pulse specifying circuit 7 by the computer 6 using a computer program. In the case of measuring the width of, for example, the Nth pulse, N is set as the set value in the pulse specifying circuit 7. In the comparing circuit 8, the value counted by the counter circuit 5 is compared with the value set in the pulse specifying circuit 7 and whether the value counted by the counter circuit 5 is equal to (N−1) or not is determined. When the comparing circuit 8 determines that the value counted by the counter circuit 5 is equal to (N−1), a signal of H level is outputted via the gate signal output circuit 9.

The output pulses 4 are also supplied to the counter circuit 11 via the delay circuit 10 and the number of trailing edges of the pulses are counted by the counter circuit 11. The comparing circuit 12 compares the value counted by the counter circuit 11 with the value set in the pulse specifying circuit 7 and whether the value counted by the counter circuit 11 is equal to N or not is determined. When the comparing circuit 12 determines that the count value of the counter circuit 11 coincides with N in a signal of L level is outputted via the gate signal output circuit 13.

The gate signals 14 generated by the gate signal output circuits 9 and 13 are supplied to the semiconductor evaluating apparatus 15 and used as external gate signals to measure the width of a pulse in the pulses having random widths.

Figure 3:
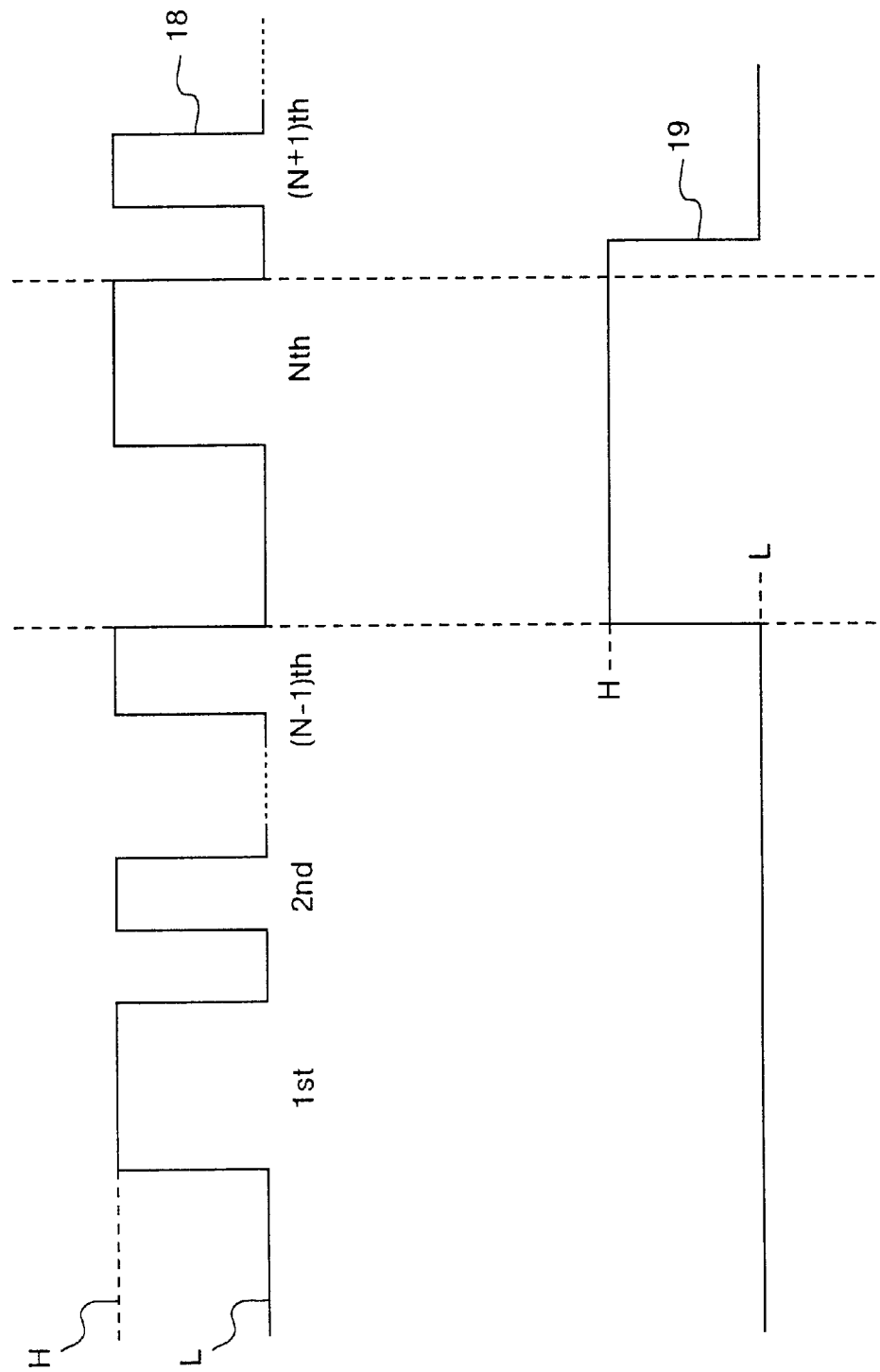
FIG. 3 is a timing chart showing output pulses and a gate signal for the output pulses in the first embodiment.

FIG. 3 is a timing chart of output pulses 18 of the integrated circuit and a gate signal 19.

With the trailing edge of the (N−1)th pulse in the output pulses 18, the comparing circuit 8 determines that the value counted by the counter circuit 5 coincides with (N−1). As a result, the gate signal output circuit 9 outputs the gate signal of H level. When the Nth pulse in the output pulses 18 falls, the counter circuit 11 counts the number of the trailing edge of the Nth pulse with a delay by the delay circuit 10. The comparing circuit 12 determines that the value counted by the counter circuit 11 coincides with N and the gate signal output circuit 13 outputs the gate signal of L level.

According to the first embodiment as described above, in pulses having random widths such as $t_1 \neq t_2 \neq \ldots \neq t_{n-1} \neq t_n \neq t_{n+1} \neq \ldots$, by specifying an arbitrary Nth pulse, a gate signal for measuring the width of the Nth pulse can be generated. The width of the Nth pulse can be measured on the basis of the gate signal.

It is not necessary to supply an external control signal to especially the gate signal generating circuit of this embodiment and the gate signal can be generated only by supplying output pulses from the device to be measured. Consequently, the circuit can be simplified and low cost of the whole apparatus can be accordingly achieved.

It is also not necessary to newly add an expensive circuit for setting a gate signal to a relatively cheap semiconductor evaluating apparatus having no function of setting a gate signal to a specific pulse. Therefore, the width of a pulse in pulses having random widths can be measured by the gate signal generating circuit at low cost.

Figure 5:
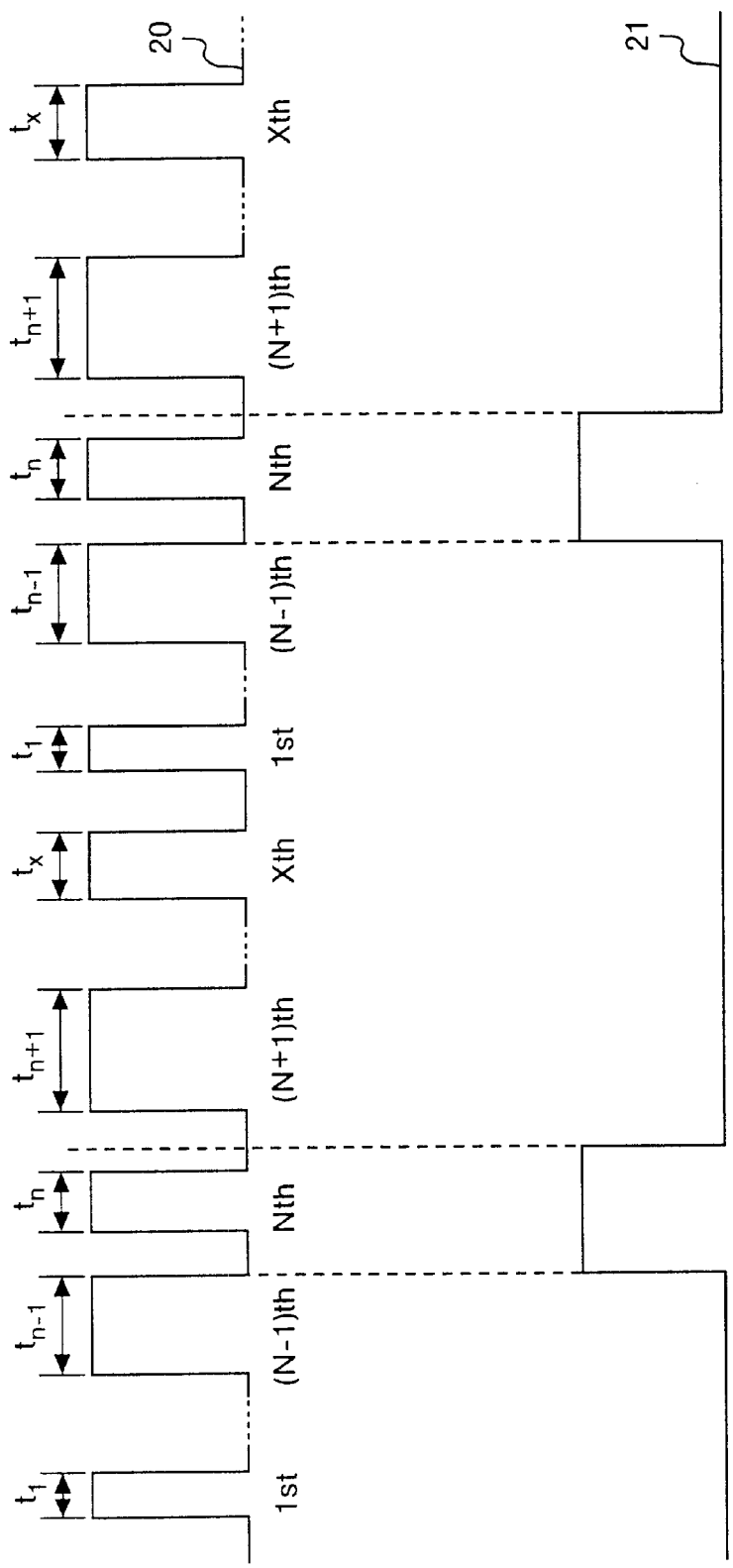
FIG. 5 is a timing chart showing output pulses and a gate signal for the output pulses in the second embodiment.

In the second embodiment, there is provided a means for generating a gate signal for measuring a specific Nth pulse in the case where, as shown in FIG. 5, the first to Xth pulses having widths of $t_1 \neq \ldots \neq t_{n-1} \neq t_n \neq t_{n+1} \neq \ldots t_x$, respectively, are repeated like ..→ . . . →(N−1)→N→(N+1)→ . . . →X→1→ . . . →(N−1)→N→(N+1)→ . . . →X→ . . .

Figure 4:
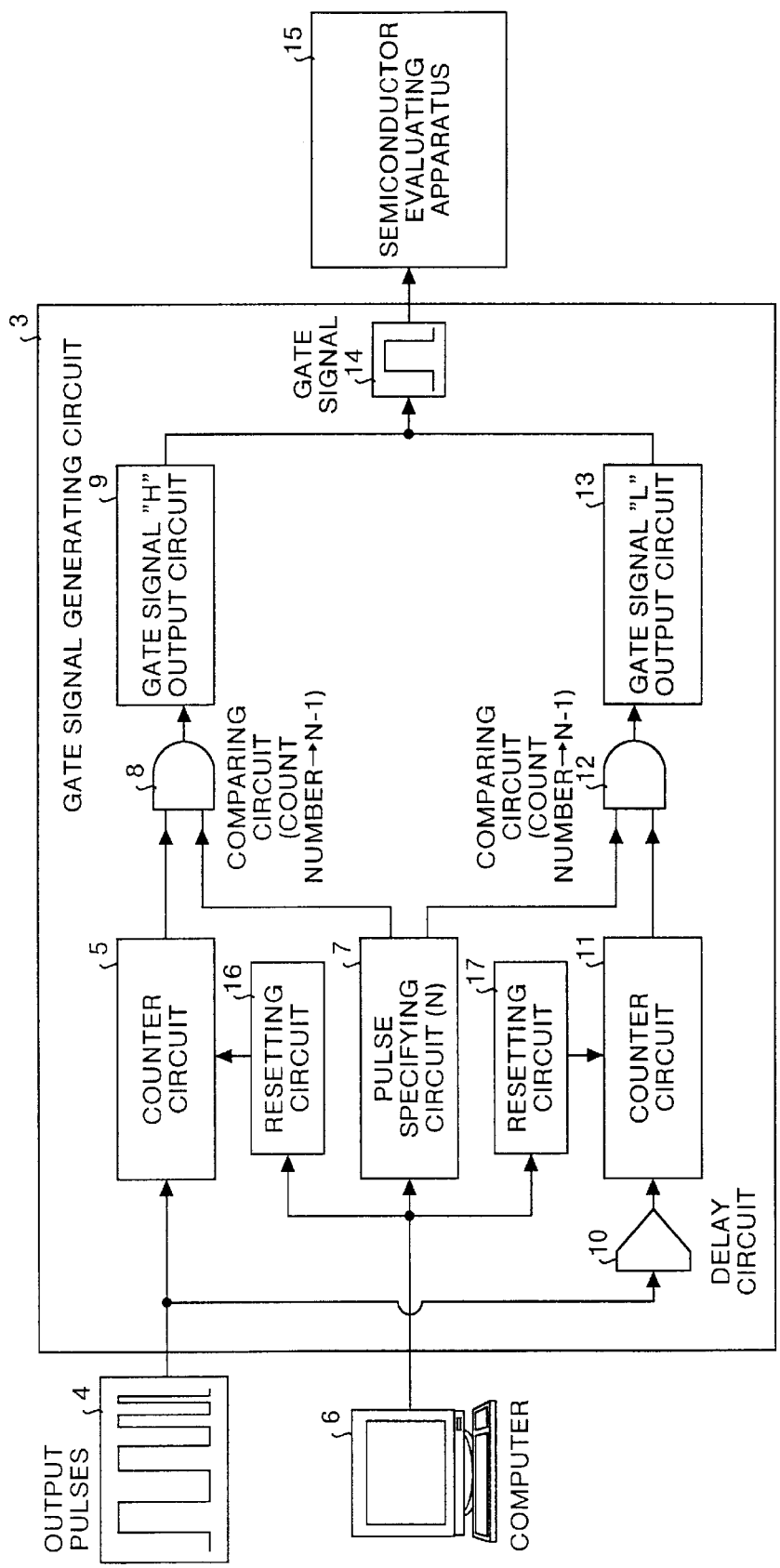
FIG. 4 is a functional block diagram showing a gate signal generating circuit and a semiconductor evaluating apparatus using the circuit according to a second embodiment of the invention.

FIG. 4 is a functional block diagram showing a gate signal generating circuit and a semiconductor evaluating apparatus using this gate signal generating circuit according to the second embodiment of the invention. The gate signal generating circuit 3 shown in FIG. 4 is provided with resetting circuits 16 and 17 to which a reset value is preliminarily set under the control of the computer 6. These resetting circuits 16 and 17 reset the values counted by the counter circuits 5 and 11 respectively. Since the other construction is similar to that of FIG. 1, the description is omitted here.

The operation of the second embodiment will be described. In the case of output pulses 20 in which the first to Xth pulses having the widths $t_1 \neq \ldots \neq t_{n-1} \neq t_n \neq t_{n+1} \neq t_x$ as shown in FIG. 5 are repeated like 1→ . . . →(N−1)→N→(N+1)→ . . . →X→1→ . . . →(N−1)→N→(N+1) . . . →X→ . . . → the reset value is set as X in each of the resetting circuits 16 and 17 using the computer 6. As a result, each of the counter circuits 5 and 11 is reset after every Xth pulse.

As shown in FIG. 5, therefore, in the first to Xth output pulses 20, the gate signal of H level is outputted at the trailing edge of the (N−1)th pulse and the gate signal of L level is outputted with a predetermined delay amount from the trailing edge of the Nth pulse. The circuit is once reset at the Xth pulse. From the first pulse after there setting to the Xth pulse, the gate signal of H level is outputted at the trailing edge of the (N−1)th pulse and the gate signal of L level is outputted with a predetermined delay from the trailing edge of the Nth pulse.

As described above, according to the second embodiment, in the case where the periodical output pulses having random widths like $t_1 \neq \ldots \neq t_{n-1} \neq t_n \neq t_{n+1} \neq t_x$ which are the first to Xth pulses are repeated like 1→ . . . →(N−1)→N→(N+1)→ . . . →X→1. . . →(N−1)→N→(N+1)→ . . . X . . . → by specifying an arbitrary Nth pulse, a gate signal for measuring the width of the Nth pulse can be generated and the width of the Nth pulse can be measured on the basis of the gate signal.

Particularly, it is not necessary to supply an external control signal to the gate signal generating circuit of this embodiment. The gate signal can be generated only by supplying the output pulses from the device to be measured. Consequently, the circuit can be simplified and the low cost of the whole apparatus can be accordingly achieved.

It is also not necessary to add an expensive option for newly setting a gate signal in a relatively cheap semiconductor evaluating apparatus which does not have the function of setting a gate signal to a specific pulse. Therefore, the width of the pulse of a waveform having random pulse widths can be measured at low cost by the gate signal generating circuit.

Figure 6:
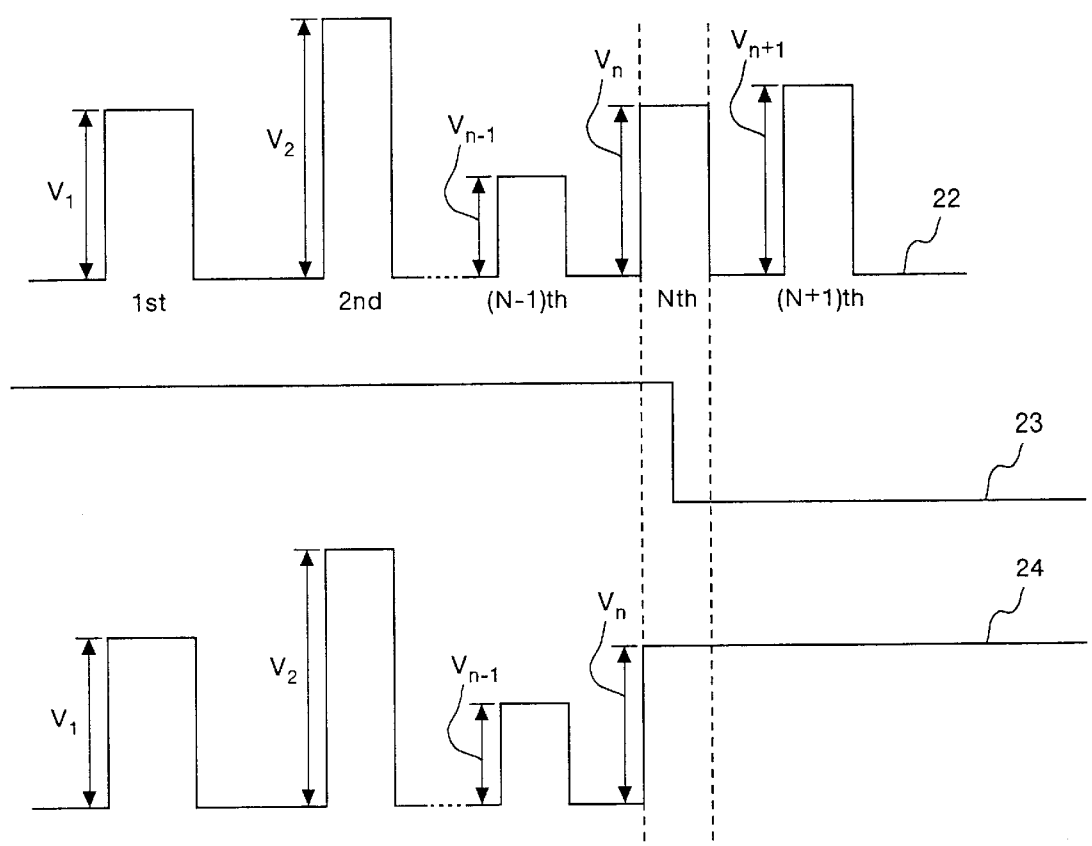
FIG. 6 is a timing chart showing output pulses whose levels are random, a gate signal for measuring the pulse level, and an output signal of a sample and hold circuit.

In the third embodiment, there is provided means for generating a gate signal for measuring the level of an arbitrary Nth pulse in the case where, as shown in FIG. 6, output pulses 22 of the device to be measured have random levels such as $v_1 \neq v_2 \neq \ldots \neq v_{n-1} \neq v_n \neq v_{n+1} \neq \ldots$.

FIG. 6 is a timing chart showing output pulses of an integrated circuit, which have random levels, a gate signal, and an output signal of a sample and hold circuit.

In FIG. 6, it is assumed that the output pulses 22 have random levels (for example, $v_1 \neq v_2 \neq \ldots \neq v_{n-1} \neq v_n \neq v_{n+1} \neq \ldots$). A gate signal 23 is outputted to a sample and hold circuit to measure the level of the Nth pulse in the output pulses 22 having random levels. An output signal 24 is a DC voltage outputted from the sample and hold circuit. That is, the sample and hold circuit outputs the output pulse 22 as a DC voltage when the gate signal 23 changes from H level to L level.

It is a precondition with respect to time of the gate signal 23 for measuring the level of the Nth pulse that the gate signal 23 changes from H level to L level during a period from the rising edge of the Nth pulse to the trailing edge of the Nth pulse.

Figure 7:
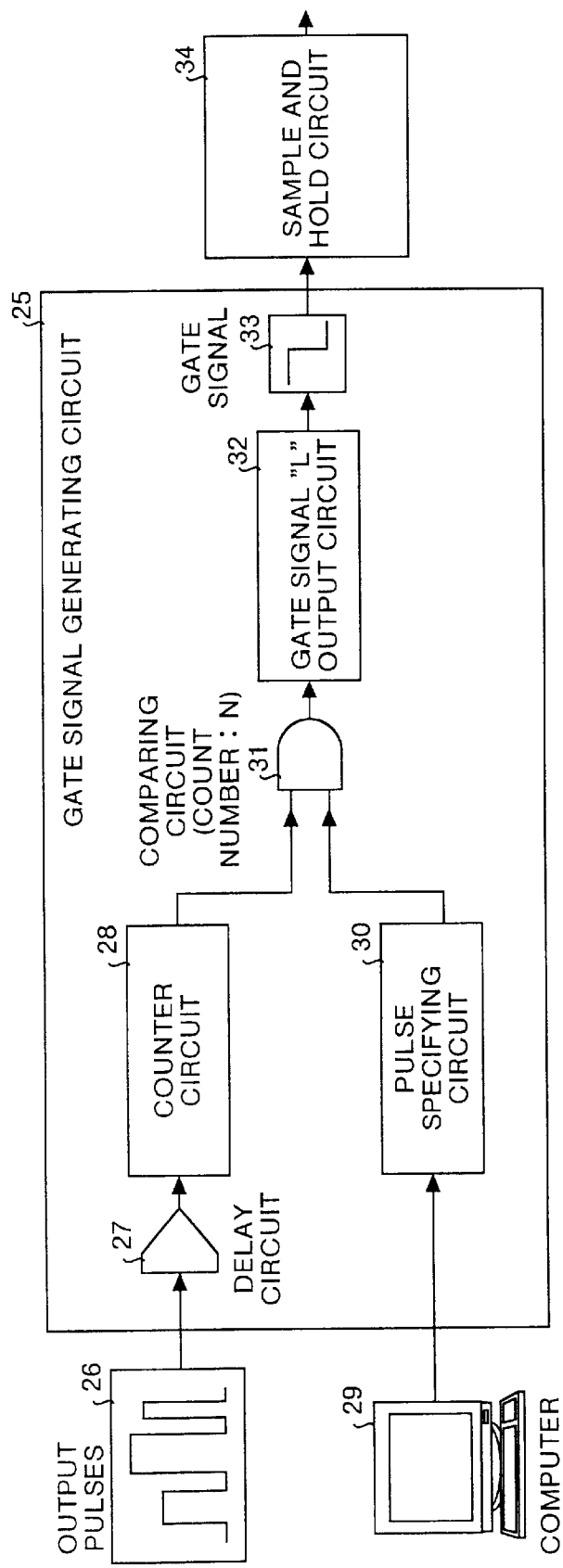
FIG. 7 is a functional block diagram showing a gate signal generating circuit according to a third embodiment of the invention.
Figure 8:
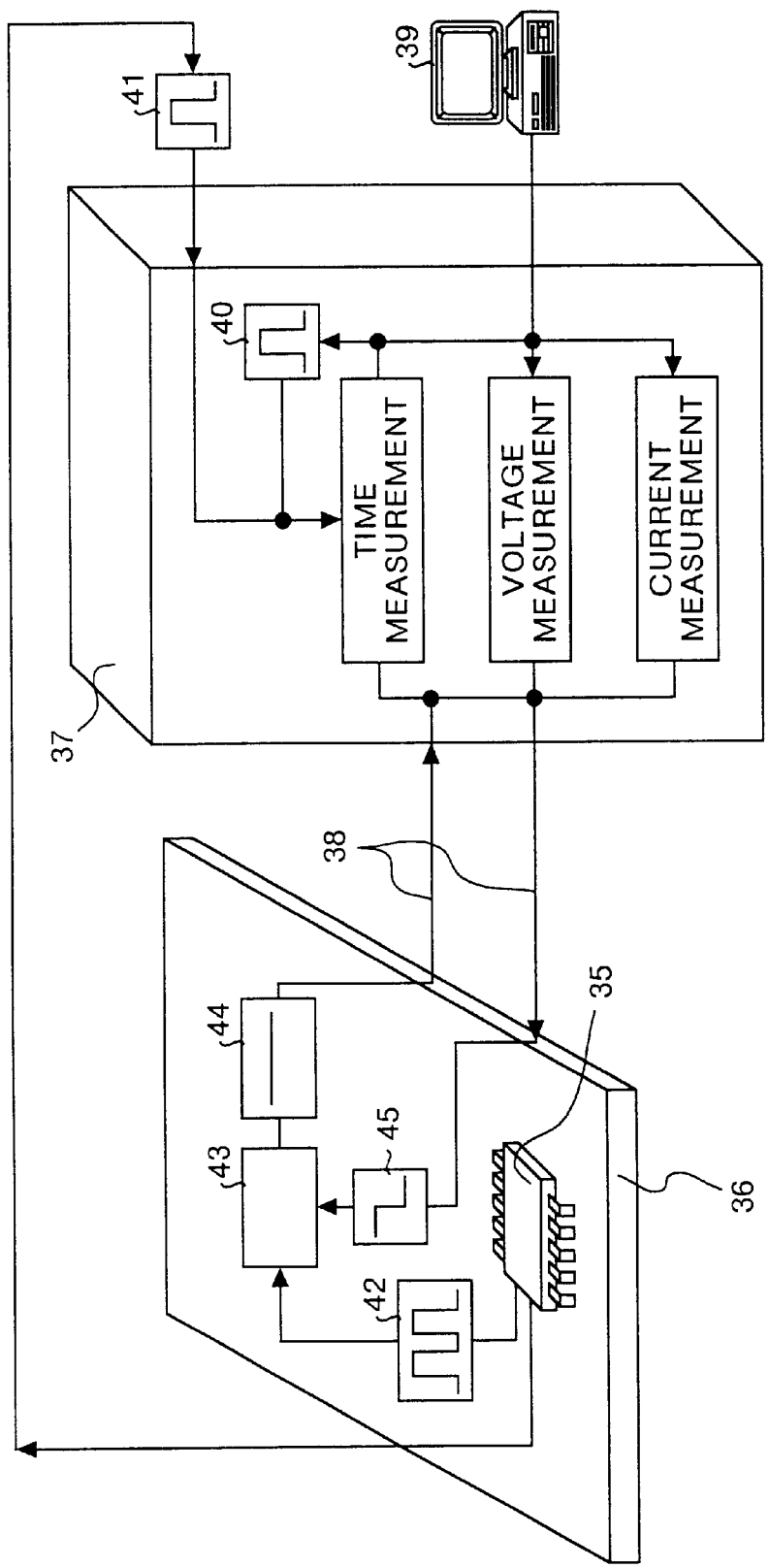
FIG. 8 is a functional block diagram showing a semiconductor evaluating system.
Figure 9:
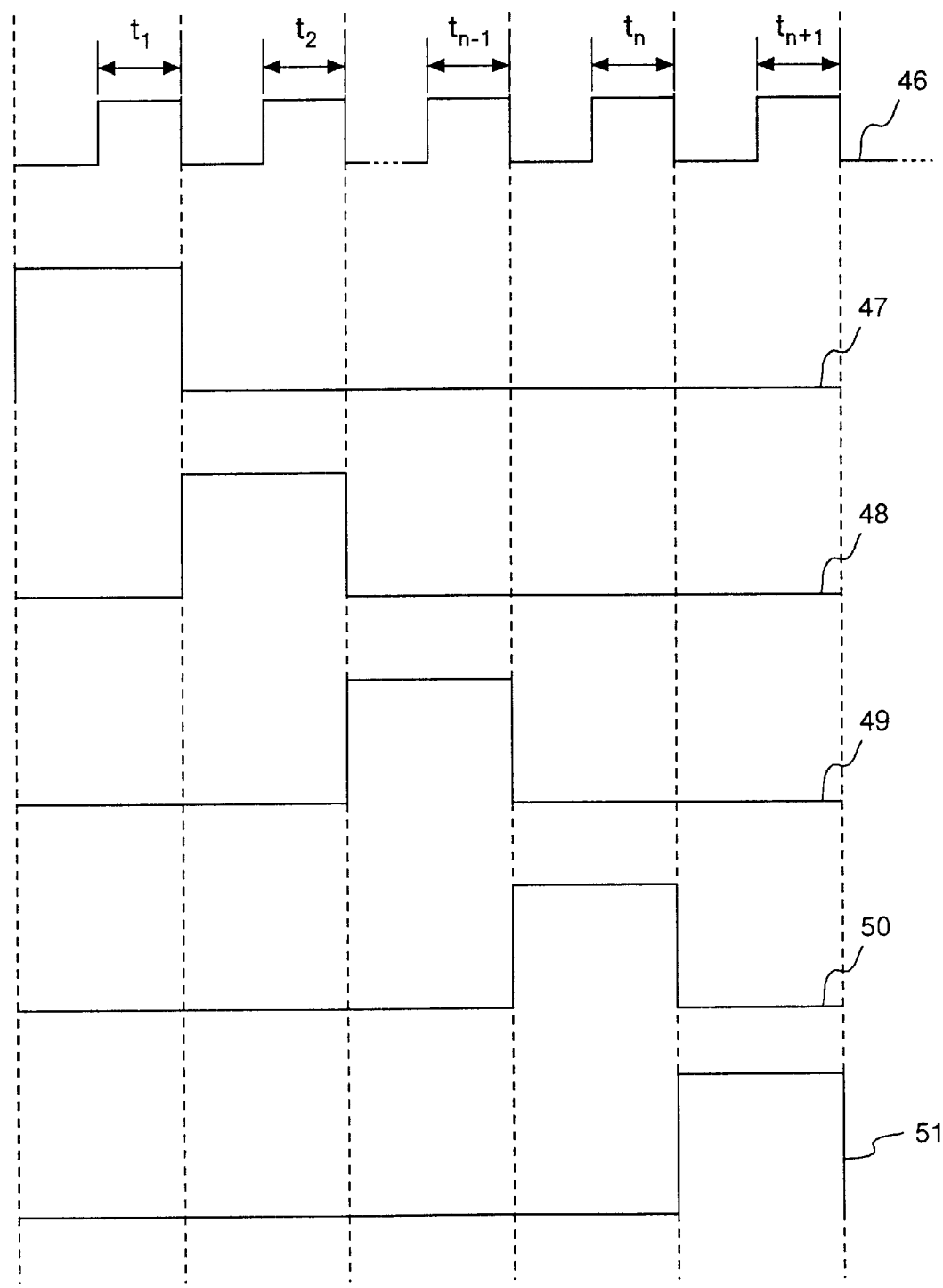
FIG. 9 is a timing chart showing output pulses having a constant pulse width and gate signals for measuring the pulse width.
Figure 10:
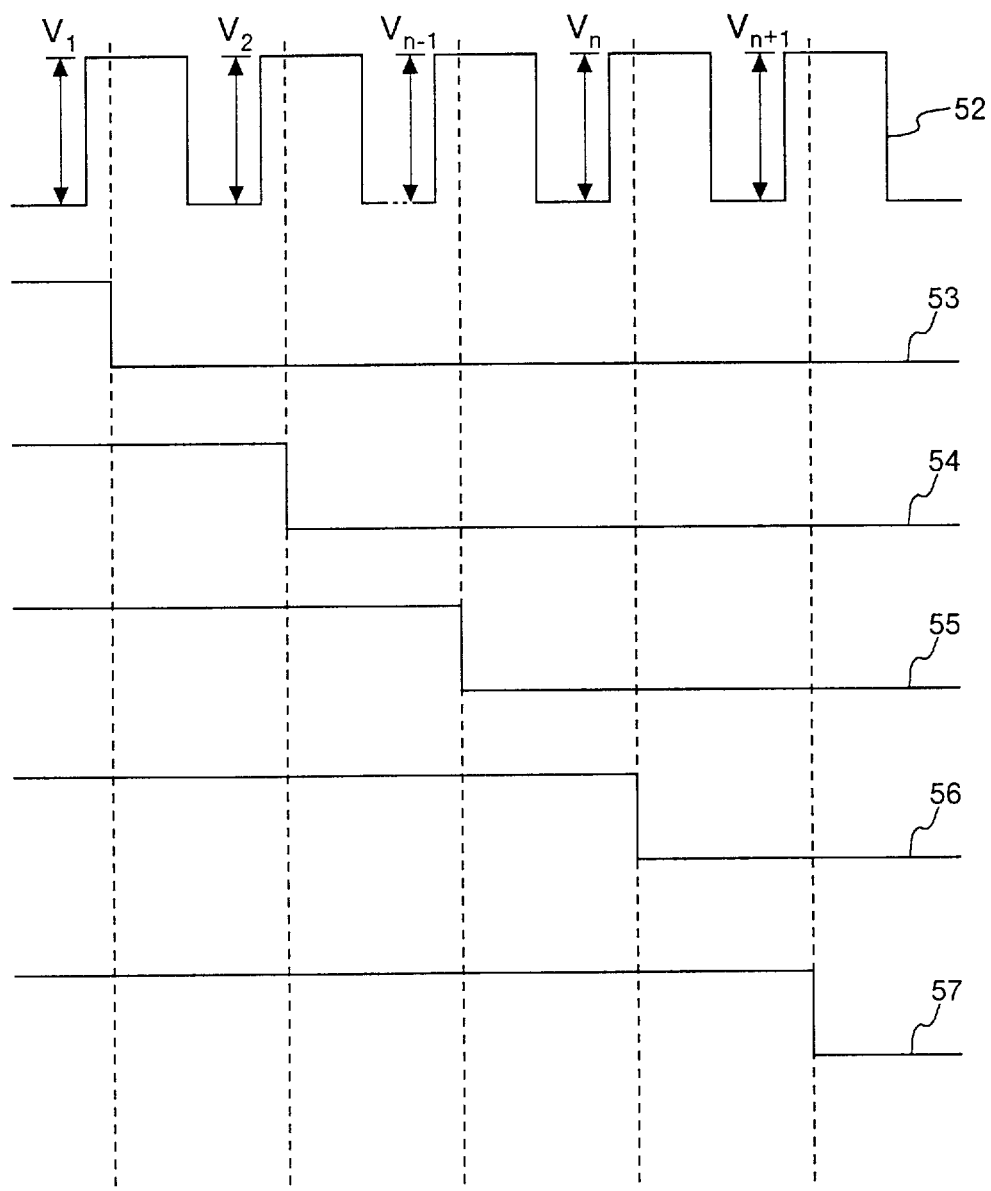
FIG. 10 is a timing chart showing output pulses having a constant pulse level and gate signals for measuring the pulse level.

FIG. 7 is a functional block diagram showing a gate signal generating circuit according to the third embodiment of the invention. The gate signal generating circuit 25 of the third embodiment is provided with, at the front stage, a counter circuit 28 for counting the number of output pulses 26 of the device to be measured and a pulse specifying circuit 30 for specifying an arbitrary (Nth) pulse whose level is to be measured.

The counter circuit 28 receives the output pulses 26 via a delay circuit 27 and counts the number of trailing edges of the pulses. In the pulse specifying circuit 30 is set the number of trailing edges of pulses under the control of a control computer 29 using a computer program. For example, when measuring the level of the Nth pulse, N is set as the set value of the pulse specifying circuit 30.

A comparing circuit 31 compares the value counted by the counter circuit 28 with the value set in the pulse specifying circuit 30. Specifically, when the value set in the pulse specifying circuit 30 is N, the comparing circuit 31 determines whether the value counted by the counter circuit 28 is equal to N or not. A gate signal output circuit 32 outputs a signal of L level when the counted value is equal to N.

A sample and hold circuit 34 receives a gate signal 33 generated by the gate signal output circuit 32 and converts the level of the output pulse 26 when the gate signal has become L level to a DC voltage. A not shown semiconductor evaluating apparatus measures the DC voltage obtained by DC conversion by the sample and hold circuit 34 as the level of the Nth pulse.

The operation of the gate signal generating circuit according to the third embodiment will now be described with reference to the drawings. The output pulses 26 from the device to be measured which are supplied to the gate signal generating circuit 25 shown in FIG. 7 are supplied to the delay circuit 27. The counter circuit 28 at the next stage counts the number of rising edges of the pulses. On the other hand, the number of rising edges of the pulses is set in the pulse specifying circuit 30 under the control of the computer 29. In this case, for example, when the level of the Nth pulse is to be measured, N is set as the set value of the pulse specifying circuit 30.

The comparing circuit 31 compares the value counted by the counter circuit 28 with the value set in the pulse specifying circuit 30. For example, when a value N is set in the pulse specifying circuit 30, the comparing circuit 31 determines whether the value counted by the counter circuit 28 is equal to N or not. When the counted value is equal to N, a gate signal of L level is outputted from the gate signal output circuit 32.

The gate signal 33 generated as described above is supplied to the sample and hold circuit 34, the DC voltage obtained by the DC conversion by the sample and hold circuit 34 is supplied to the not shown semiconductor evaluating apparatus, and the level of the pulse is measured.

According to the third embodiment as described above, in the case where the output pulses have the random levels like $V_1 \neq V_2 \neq \ldots \neq V_{n-1} \neq V_n \neq V_{n+1} \neq \ldots$, by specifying an arbitrary Nth pulse, the gate signal for measuring the level of the Nth pulse can be generated. The level of the Nth pulse can be measured on the basis of the gate signal.

Particularly, it is not necessary to supply an external control signal to the gate signal generating circuit of the embodiment. The gate signal can be generated only by inputting the output pulses of the device to be measured. Consequently, the circuit can be simplified and the low cost of the whole apparatus can be accordingly achieved.

It is also not necessary to add an expensive option for newly setting a gate signal in a relatively cheap semiconductor evaluating apparatus which does not have the function of setting a gate signal to a specific pulse. Therefore, the width of the pulse of a waveform having random pulse widths can be measured at low cost by the gate signal generating circuit.

Note 1: A semiconductor evaluating apparatus which measuring the width of an arbitrary Nth (where N is an integer) pulse out of continuously outputted pulses from pulse 1 to pulse N+1 based on a gate signal generated by the gate signal generating circuit, wherein said gate signal generating circuit comprises, a pulse specifying unit which specifies the number N; and a gate signal generating unit which receives the pulses and generates a gate signal which is at high level during a period from the end of (N−1)th pulse to the start of the Nth pulse and which is at low level during a period from the end of the Nth pulse to the start of the (N+1)th pulse.

Note 2: A semiconductor evaluating apparatus which measuring the width of an arbitrary Nth (where N is an integer) pulse out of continuously and repeatedly outputted pulses from pulse 1 to pulse X (where X is an integer such that X>N) based on a gate signal generated by the gate signal generating circuit, wherein said gate signal generating circuit comprises, a pulse specifying unit which specifies the number N and the number X; and a gate signal generating unit which receives the pulses and generates a gate signal which is at high level during a period from the end of the (N−1)th pulse to the start of the Nth pulse and which is at low level during a period from the end of the Nth pulse to the start of the (N+1)th pulse for every set of pulses from pulse 1 to pulse X.

Note 3: A semiconductor evaluating apparatus which uses a gate signal generated by a gate signal generating circuit, holds the output level of a pulse when the gate signal is activated, and measures the level of the Nth pulse, wherein said gate signal generating circuit generates a gate signal for measuring the properties of an arbitrary Nth (where N is an integer) pulse out of continuously outputted pulses from pulse 1 to pulse N+1 and comprises, a pulse specifying unit which specifies the number N; and a gate signal generating unit which receives the pulses and generates a gate signal which is at high level during a period from the start of the Nth pulse to the end of the Nth pulse.

Note 4: A semiconductor evaluating method of measuring the properties of an arbitrary Nth (where N is an integer) pulse out of continuously outputted pulses from pulse 1 to pulse N+1, said method comprising the steps of:

specifying the number N, receiving the pulses and generating a gate signal which is at high level during a period from the end of (N−1)th pulse to the start of the Nth pulse and which is at low level during a period from the end of the Nth pulse to the start of the (N+1)th pulse; and measuring the width of the Nth pulse based on the generated gate signal.

Note 5: A semiconductor evaluating method of measuring the properties of an arbitrary Nth (where N is an integer) pulse out of continuously and repeatedly outputted pulses from pulse 1 to pulse X (where X is an integer such that X>N), said method comprising the steps of:

specifying the number N and the number X;

receiving the pulses and generating a gate signal which is at high level during a period from the end of the (N−1)th pulse to the start of the Nth pulse and which is at low level during a period from the end of the Nth pulse to the start of the (N+1)th pulse for every set of pulses from pulse 1 to pulse X; and measuring the width of the Nth pulse based on the generated gate signal.

Note 6: A semiconductor evaluating method of measuring the properties of an arbitrary Nth (where N is an integer) pulse out of continuously outputted pulses from pulse 1 to pulse N+1, said method comprising the steps of:
  specifying the number N;
  receiving the pulses and generating a gate signal which is at high level during a period from the start of the Nth pulse to the end of the Nth pulse; and
  a step of holding the output level of a pulse when the gate signal is activated and measuring the pulse level of the Nth pulse.

According to one aspect of this invention, an arbitrary Nth pulse in pulses to be measured which are continuously outputted in the order of 1→2→ . . . →(N−1)→N→(N+1) . . . (N is an integer) is specified, the gate signal which is at high level during a period from the end of the (N−1)th pulse to the start of the Nth pulse and which is at low level during a period from the end of the Nth pulse to the start of the (N+1)th pulse is generated, and the width of the Nth pulse is measured by using the gate signal. Consequently, even when the output pulses have the random widths, a gate signal for measuring the width of an arbitrary Nth pulse can be generated and the width of the Nth pulse can be measured on the basis of the gate signal.

According to another aspect of this the invention, an arbitrary Nth pulse in pulses to be measured which are outputted in such a manner that the first to the Xth pulses are periodically repeated like 1→2→ . . . →(N−1)→N→(N+1)→ . . . →X→1→2→ . . . (N−1)→N→(N+1) . . . →X→ . . . (N and X are integers) is specified, a gate signal which is at high level during a period from the end of the (N−1)th pulse to the start of the Nth pulse and which is at low level during a period from the end of the Nth pulse to the start of the (N+1)th pulse is generated, and the width of the Nth pulse is measured by using the gate signal. Consequently, even when the output pulses have the random widths, a gate signal for measuring the width of an arbitrary Nth pulse can be generated and the width of the Nth pulse can be measured on the basis of the gate signal.

According to still another aspect of this invention, an arbitrary Nth pulse in pulses to be measured which are continuously outputted in the order of 1→2→ . . . (N−1) N→(N+1)→ . . . (N is an integer) is specified, a gate signal which is at high level during a period from the start of the Nth pulse to the end of the Nth pulse is generated, the output level of the pulse to be measured at the time point the gate signal goes high is held, and the level of the Nth pulse is measured. Consequently, even when the output pulses have the random levels, a gate signal for measuring the level of an arbitrary Nth pulse can be generated and the level of the Nth pulse can be measured on the basis of the gate signal.

Particularly, it is not necessary to supply an external control signal to the gate signal generating circuit of the invention. The gate signal can be generated only by inputting the output pulses of the device to be measured. Consequently, the circuit can be simplified and the low cost of the whole apparatus can be accordingly achieved.

Further, it is also not necessary to add an expensive option for newly setting a gate signal in a relatively cheap semiconductor evaluating apparatus which does not have the function of setting a gate signal to a specific pulse. Therefore, the width of the pulse of a waveform having random pulse widths can be measured at low cost by the gate signal generating circuit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A gate signal generating circuit for measuring properties of an Nth pulse (where N is an integer) of continuously outputted pulses from a first pulse to an (N+1)th pulse and including an (N−1)th pulse, said circuit comprising:
  a pulse specifying unit which specifies N; and
  a gate signal generating unit which receives the pulses and generates a gate signal changing from a first level to a second level in a period from ending of the (N−1)th pulse to starting of the Nth pulse, and reverting to the first level in a period from ending of the Nth pulse to starting of the (N+1)th pulse.

2. The gate signal generating circuit according to claim 1, wherein the gate signal is at the second level at the ending of the (N−1)th pulse and is at the first level after a predetermined time after the ending of the Nth pulse.

3. A gate signal generating circuit for measuring properties of an Nth pulse (where N is an integer) of continuously and repeatedly outputted pulses from a first pulse to an Xth pulse (where X is an integer such that X>N) including an (N−1)th pulse and an (N+1)th pulse, said circuit comprising:
  a pulse specifying unit which specifies N and X; and
  a gate signal generating unit which receives the pulses and generates a gate signal changing from a first level to a second level in a period from ending of the (N−1)th pulse to starting of the Nth pulse, and reverting to the first level in a period from ending of the Nth pulse to starting of the (N+1)th pulse for every set of pulses from the first pulse to the Xth pulse.

4. The gate signal generating circuit according to claim 3, wherein the gate signal is at the second level at the ending of the (N−1)th pulse and is at the first level after a predetermined time after the ending of the Nth pulse.

5. A gate signal generating circuit for measuring properties of an Nth pulse (where N is an integer) of continuously outputted pulses from a first pulse to an (N+1)th pulse, said circuit comprising:
  a pulse specifying unit which specifies N; and
  a gate signal generating unit which receives the pulses and generates a gate signal switching from a second level to a first level in a period from starting of the Nth pulse to ending of the Nth pulse.

6. The gate signal generating circuit according to claim 5, wherein the gate signal is at the second level after a predetermined time after the starting of the Nth pulse.

7. A gate signal generating circuit for measuring pulse level of an Nth pulse (where N is an integer) of continuously outputted pulses having variable levels, from a first pulse to an (N+1)th pulse, said circuit comprising:
  a pulse specifying unit which specifies N for measuring the level of the Nth pulse; and
  a gate signal generating unit which receives a comparison of the pulses received to N, and generates a gate signal changing in level during the Nth pulse to measure the level of the Nth pulse.

8. The gate signal generating circuit according to claim 7, wherein the gate signal is at the second level after a predetermined time after the starting of the Nth pulse.

9. The gate signal generating circuit according to claim 1, wherein the continuously outputted pulses have varying pulse widths and a property of the Nth pulse measured is the pulse width of the Nth pulse.

10. The gate signal generating circuit according to claim 3, wherein the continuously outputted pulses have varying pulse widths and a property of the Nth pulse measured is the pulse width of the Nth pulse.

* * * * *